United States Patent
Jang

(10) Patent No.: US 8,947,119 B2
(45) Date of Patent: Feb. 3, 2015

(54) IMPEDANCE CALIBRATION CIRCUITS WITH ADJUSTABLE REFERENCE VOLTAGES

(71) Applicant: SK hynix Inc., Icheon (KR)

(72) Inventor: Dong Wook Jang, Seoul (KR)

(73) Assignee: SK hynix Inc., Icheon (KR)

( * ) Notice: Subject to any disclaimer, the term of this patent is extended or adjusted under 35 U.S.C. 154(b) by 150 days.

(21) Appl. No.: 13/717,521

(22) Filed: Dec. 17, 2012

(65) Prior Publication Data
US 2014/0002130 A1 Jan. 2, 2014

(30) Foreign Application Priority Data

Jun. 29, 2012 (KR) .................. 10-2012-0070625

(51) Int. Cl.
H03H 11/30 (2006.01)
H03K 17/16 (2006.01)

(52) U.S. Cl.
CPC .............. *H03K 17/16* (2013.01); *H03K 17/166* (2013.01); *H03K 2217/0063* (2013.01); *H03K 2217/0072* (2013.01)
USPC ................. 326/30; 326/31; 326/33; 327/108; 327/112

(58) Field of Classification Search
CPC ........... G06F 13/4086; H03K 19/0005; H03K 19/00361; H03K 19/00384; H04L 25/0278; H04L 25/0298; H04L 25/028
USPC .......................... 326/30, 31, 33; 327/108, 112
See application file for complete search history.

(56) References Cited

U.S. PATENT DOCUMENTS

| 6,133,863 | A * | 10/2000 | Peng ............................. 341/120 |
| 7,589,554 | B2 * | 9/2009 | Hamanaka ....................... 326/30 |
| 7,688,105 | B2 * | 3/2010 | Wong ............................. 326/30 |
| 7,859,296 | B2 * | 12/2010 | Kim et al. ....................... 326/30 |
| 2010/0060316 | A1 * | 3/2010 | Kim et al. ....................... 326/30 |
| 2012/0105100 | A1 * | 5/2012 | Kim ............................... 326/30 |
| 2012/0146687 | A1 * | 6/2012 | Kim ............................... 326/30 |
| 2013/0088258 | A1 * | 4/2013 | Yokou et al. .................... 326/30 |
| 2013/0113515 | A1 * | 5/2013 | Lee ............................... 326/30 |
| 2013/0154689 | A1 * | 6/2013 | Shon ............................ 327/90 |
| 2013/0335135 | A1 * | 12/2013 | Chen ........................... 327/509 |
| 2014/0159769 | A1 * | 6/2014 | Hong et al. ..................... 326/30 |

FOREIGN PATENT DOCUMENTS

KR 10-0879747 B1 1/2009

* cited by examiner

*Primary Examiner* — Alexander H Taningco
*Assistant Examiner* — Kurtis R Bahr

(57) ABSTRACT

An impedance calibration circuit includes a first calibration voltage driver configured to operate in response to a first enable signal, compare a first calibration voltage signal with a first reference voltage signal, and drive the first calibration voltage signal, a first control code generator configured to operate in response to a second enable signal, compare the first calibration voltage signal with a first target voltage signal, and generate a first control code signal, and a first reference voltage generator configured to generate the first reference voltage signal in response to the first control code signal.

21 Claims, 9 Drawing Sheets

FIG.4

| CTR1<2> | CTR1<1> | DEC1<4> | DEC1<3> | DEC1<2> | DEC1<1> | VREF1 |
|---|---|---|---|---|---|---|
| L | L | L | L | L | H | VDIV1 |
| L | H | L | L | H | L | VDIV2 |
| H | L | L | H | L | L | VDIV3 |
| H | H | H | L | L | L | VDIV4 |

FIG.7

| CTR2<2> | CTR2<1> | DEC2<4> | DEC2<3> | DEC2<2> | DEC2<1> | VREF2 |
|---|---|---|---|---|---|---|
| L | L | L | L | L | H | VDIV5 |
| L | H | L | L | H | L | VDIV6 |
| H | L | L | H | L | L | VDIV7 |
| H | H | H | L | L | L | VDIV8 |

US 8,947,119 B2

IMPEDANCE CALIBRATION CIRCUITS WITH ADJUSTABLE REFERENCE VOLTAGES

CROSS-REFERENCES TO RELATED APPLICATIONS

The present application claims priority under 35 U.S.C 119(a) to Korean Application No. 10-2012-0070625, filed on Jun. 29, 2012, in the Korean Intellectual Property Office, which is incorporated herein by reference in its entirety as set forth in full.

BACKGROUND

Within semiconductor systems, it is generally necessary to match the impedance of a transmission line (e.g., a transmission channel) with the corresponding termination impedance of a termination resistor in order to prevent undesirable signal reflections. Such signal reflections act as noise on the transmission line in relation to signals subsequently transmitted on the transmission line. Termination resistors of conventional semiconductor modules or systems are often disposed outside semiconductor chips constituting the semiconductor modules or systems. However, in the event that the termination resistors are disposed outside high performance semiconductor chips such as double data rate 2 (DDR2) synchronous dynamic random access memory (SDRAM) chips, there may be some limitations in preventing undesirable signal reflections.

Recently, termination resistors have been provided inside high performance semiconductor chips to prevent undesirable signal reflections. That is, on-die termination (ODT) circuits have been widely used in semiconductor modules and/or semiconductor systems. The ODT circuits include switching circuits, which are turned on or off to control currents that flow therein. Thus, power consumption of the semiconductor modules including ODT circuits may be reduced as compared with semiconductor modules including termination resistors disposed outside the semiconductor chips. Resistance values of the ODT circuits may vary according to process/voltage/temperature (PVT) conditions. Hence, it may be necessary to calibrate the resistance values of the ODT circuits using impedance calibration circuits before the ODT circuits are utilized.

The impedance calibration circuits may employ a comparator that compares a reference voltage with a resistance value of a resistor (e.g., an external resistor) connected to a pad so as to generate a pull-up code signal and a pull-down code signal for calibrating a resistance value of the ODT circuit. The external resistor connected to the pad may have a constant resistance, e.g., 240Ω, regardless of the PVT condition.

SUMMARY

In an embodiment, an impedance calibration circuit includes a first calibration voltage driver configured to operate in response to a first enable signal, compare a first calibration voltage signal induced at a pad connected to an external resistor with a first reference voltage signal, and drive the first calibration voltage signal, a first control code generator configured to operate in response to a second enable signal, compare the first calibration voltage signal with a first target voltage signal, and generate a first control code signal, and a first reference voltage generator configured to generate the first reference voltage signal in response to the first control code signal. A voltage level of the first reference voltage signal is controlled by the first control code signal.

In another embodiment, an impedance calibration circuit includes a first calibration voltage driver configured to operate in response to a first enable signal, compare a first calibration voltage signal induced at a pad connected to an external resistor with first and second reference voltage signals, and drive the first calibration voltage signal, a first control code generator configured to operate in response to a second enable signal, compare the first calibration voltage signal with a first target voltage signal, and generate a first control code signal, and a first reference voltage generator configured to generate the first and second reference voltage signals in response to the first control code signal. Voltage levels of the first and second reference voltage signals are controlled by the first control code signal.

BRIEF DESCRIPTION OF THE DRAWINGS

Embodiments will become more apparent in view of the attached drawings and accompanying detailed description, in which:

FIG. 4 is a truth table illustrating an operation of the first reference voltage generator shown in FIG. 3;

FIG. 7 is a truth table illustrating an operation of the second reference voltage generator shown in FIG. 6;

DETAILED DESCRIPTION OF THE EMBODIMENTS

Embodiments will be described hereinafter with reference to the accompanying drawings. However, the embodiments described herein are for illustrative purposes only and are not intended to limit the scope of the present invention.

Figure 1:
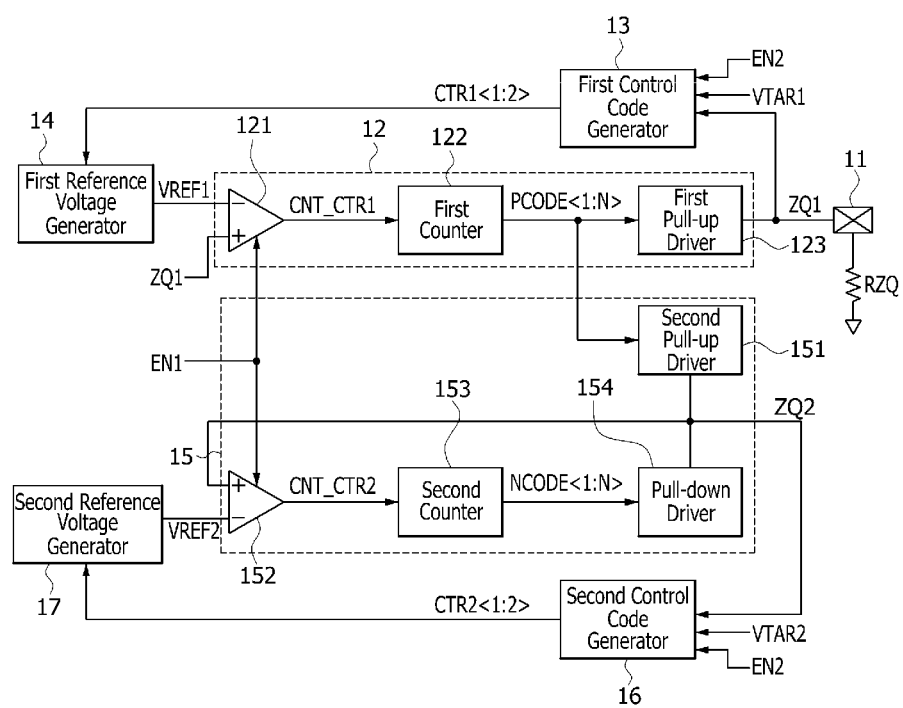
FIG. 1 is a block diagram of an impedance calibration circuit according to an embodiment.

FIG. 1 is a block diagram of an impedance calibration circuit according to an embodiment.

Referring to FIG. 1, the impedance calibration circuit includes a pad 11, a first calibration voltage driver 12, a first control code generator 13, a first reference voltage generator 14, a second calibration voltage driver 15, a second control code generator 16, and a second reference voltage generator 17. The pad 11 is electrically coupled to an external resistor RZQ having a constant resistance value regardless of a process/voltage/temperature (PVT) condition. The external resistor RZQ may have a different resistance value according to embodiments.

The first calibration voltage driver 12 operates in response to a first enable signal EN1 and compares a first calibration voltage signal ZQ1 with a first reference voltage signal VREF1 to drive the first calibration voltage signal ZQ1. The first control code generator 13 operates in response to a second enable signal EN2 and compares the first calibration voltage signal ZQ1 with a first target voltage signal VTAR1 to generate a first control code signal CTR1<1:2>. The first reference voltage generator 14 generates the first reference voltage signal VREF1 in response to the first control code signal CTR1<1:2>. A voltage level of the first reference voltage signal VREF1 is controlled by the first control code signal CTR1<1:2>.

The second calibration voltage driver 15 operates in response to the first enable signal EN1 and compares a second calibration voltage signal ZQ2 with a second reference voltage signal VREF2 to drive the second calibration voltage signal ZQ2. The second control code generator 16 operates in response to the second enable signal EN2 and compares the second calibration voltage signal ZQ2 with a second target voltage signal VTAR2 to generate a second control code signal CTR2<1:2>. The second reference voltage generator 17 generates the second reference voltage signal VREF2 in response to the second control code signal CTR2<1:2>. A voltage level of the second reference voltage signal VREF2 is controlled by the second control code signal CTR2<1:2>.

The first enable signal EN1 may be enabled during an impedance calibration period. The second enable signal EN2 may be enabled to calibrate the first and second reference voltage signals VREF1 and VREF2 in the impedance calibration period. That is, the second enable signal EN2 may be enabled in a period when the first enable signal EN1 is enabled. In some embodiments, the first and second enable signals EN1 and EN2 may be set to have several different enable periods.

The first calibration voltage driver 12 includes a first comparator 121, a first counter 122 and a first pull-up driver 123. The first comparator 121 compares the first calibration voltage signal ZQ1 with the first reference voltage signal VREF1 to generate a first count control signal CNT_CTR1. The first counter 122 outputs a counted value, e.g., a pull-up code signal PCODE<1:N>, in response to the first count control signal CNT_CTR1. The first pull-up driver 123 pulls up the first calibration voltage signal ZQ1 in response to the pull-up code signal PCODE<1:N>. If the first calibration voltage signal ZQ1 has a higher level than the first reference voltage signal VREF1, the first count control signal CNT_CTR1 may be generated to have a logic "high" state. Thus, the first calibration voltage driver 12 may output the pull-up code signal PCODE<1:N> to decrease the level of the first calibration voltage signal ZQ1. On the other hand, if the first calibration voltage signal ZQ1 has a lower level than the first reference voltage signal VREF1, the first count control signal CNT_CTR1 may be generated to have a logic "low" state. Thus, the first calibration voltage driver 12 may output the pull-up code signal PCODE<1:N> to increase the level of the first calibration voltage signal ZQ1.

The second calibration voltage driver 15 includes a second pull-up driver 151, a second comparator 152, a second counter 153, and a pull-down driver 154. The second pull-up driver 151 pulls up the second calibration voltage signal ZQ2 in response to the pull-up code signal PCODE<1:N>. The second comparator 152 compares the second calibration voltage signal ZQ2 with the second reference voltage signal VREF2 to generate a second count control signal CNT_CTR2. The second counter 153 outputs a counted value, e.g., a pull-down code signal NCODE<1:N>, in response to the second count control signal CNT_CTR2. The pull-down driver 154 pulls down the second calibration voltage signal ZQ2 in response to the pull-down code signal NCODE<1:N>. If the second calibration voltage signal ZQ2 has a higher level than the second reference voltage signal VREF2, the second count control signal CNT_CTR2 may be generated to have a logic "high" state. Thus, the second calibration voltage driver 15 may output the pull-down code signal NCODE<1:N> to decrease the level of the second calibration voltage signal ZQ2. On the other hand, if the second calibration voltage signal ZQ2 has a lower level than the second reference voltage signal VREF2, the second count control signal CNT_CTR2 may be generated to have a logic "low" state. Thus, the second calibration voltage driver 15 may output the pull-down code signal NCODE<1:N> to increase the level of the second calibration voltage signal ZQ2.

Hereinafter, configurations and operations of the first control code generator 13, the first reference voltage generator 14, the second control code generator 16, and the second reference voltage generator 17 will be described in more detail with reference to FIGS. 2 to 7.

Figure 2:
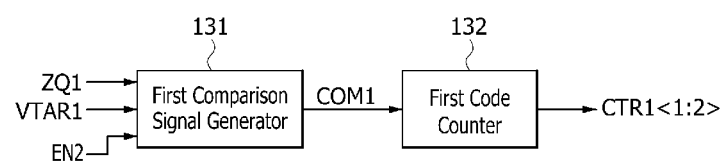
FIG. 2 is a block diagram of a first control code generator included in the impedance calibration circuit shown in FIG. 1 according to an embodiment.

Referring to FIG. 2, the first control code generator 13 includes a first comparison signal generator 131 and a first code counter 132. The first comparison signal generator 131 operates in response to the second enable signal EN2 and compares the first calibration voltage signal ZQ1 with the first target voltage signal VTAR1 to generate a first comparison signal COM1. The first comparison signal COM1 may be generated to have a logic "high" state if the first calibration voltage signal ZQ1 has a higher level than the first target voltage signal VTAR1. On the other hand, the first comparison signal COM1 may be generated to have a logic "low" state if the first calibration voltage signal ZQ1 has a lower level than the first target voltage signal VTAR1. When the first comparison signal COM1 has the logic "high" state, the first code counter 132 may generate the first control code signal CTR1<1:2>, which is counted to increase by one bit. On the other hand, when the first comparison signal COM1 has the logic "low" state, the first code counter 132 may generate the first control code signal CTR1<1:2> which is counted to decrease by one bit.

Figure 3:
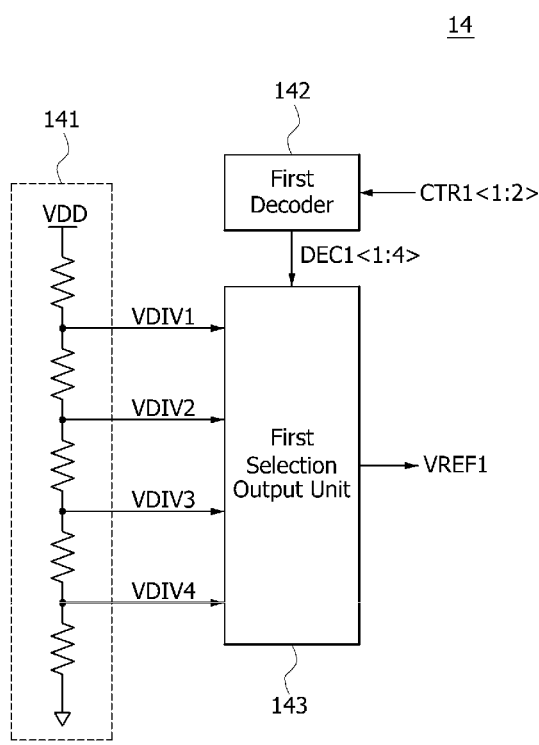
FIG. 3 illustrates a first reference voltage generator included in the impedance calibration circuit shown in FIG. 1 according to an embodiment.

Referring to FIG. 3, the first reference voltage generator 14 includes a first voltage divider 141, a first decoder 142, and a first selection output unit 143. The first voltage divider 141 divides a power supply voltage VDD to generate a first division voltage signal VDIV1 having a first division voltage level, a second division voltage signal VDIV2 having a second division voltage level, a third division voltage signal VDIV3 having a third division voltage level, and a fourth division voltage signal VDIV4 having a fourth division voltage level. The first decoder 142 decodes the first control code signal CTR1<1:2> to generate a first decode signal DEC1<1:4>. The first selection output unit 143 selects one of the first to fourth division voltage signals VDIV1, VDIV2, VDIV3, and VDIV4 in response to the first decode signal DEC1<1:4> and outputs the selected division voltage signal as the first reference voltage signal VREF1.

Operations of the first reference voltage generator 14 will be described hereinafter with reference to a truth table illustrated in FIG. 4. The following description will be developed under the assumption that the second division voltage signal VDIV2 is initially selected and outputted as the first reference voltage signal VREF1. When the first calibration voltage signal ZQ1 has a higher level than the first target voltage signal VTAR1, the first control code signal CTR1<1:2> may be counted to increase by one bit. Thus, only a third signal DEC1<3> of the first decode signal DEC1<1:4> may have a logic "high" state. Accordingly, the third division voltage signal VDIV3 having a lower level than the second division voltage signal VDIV2 may be selected and outputted as the first reference voltage signal VREF1. On the other hand, when the first calibration voltage signal ZQ1 has a lower level than the first target voltage signal VTAR1, the first control code signal CTR1<1:2> may be counted to decrease by one bit. Thus, only a first signal DEC1<1> of the first decode signal DEC1<1:4> may have a logic "high" state. Accordingly, the first division voltage signal VDIV1 having a higher level than the second division voltage signal VDIV2 may be selected and outputted as the first reference voltage signal VREF1.

Figure 5:
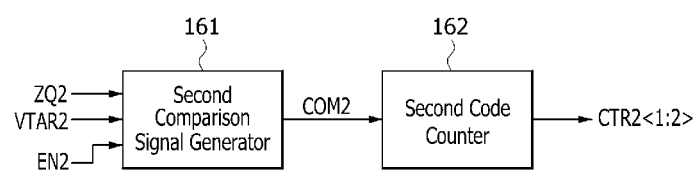
FIG. 5 is a block diagram of a second control code generator included in the impedance calibration circuit shown in FIG. 1 according to an embodiment.

Referring to FIG. 5, the second control code generator 16 includes a second comparison signal generator 161 and a second code counter 162. The second comparison signal generator 161 operates in response to the second enable signal EN2 and compares the second calibration voltage signal ZQ2 with the second target voltage signal VTAR2 to generate a second comparison signal COM2. The second comparison signal COM2 may be generated to have a logic "high" state if the second calibration voltage signal ZQ2 has a higher level than the second target voltage signal VTAR2. On the other hand, the second comparison signal COM2 may be generated to have a logic "low" state if the second calibration voltage signal ZQ2 has a lower level than the second target voltage signal VTAR2. When the second comparison signal COM2 has the logic "high" state, the second code counter 162 may generate the second control code signal CTR2<1:2> which is counted to decrease by one bit. On the other hand, when the second comparison signal COM2 has the logic "low" state, the second code counter 162 may generate the second control code signal CTR2<1:2> which is counted to decrease by one bit.

Figure 6:
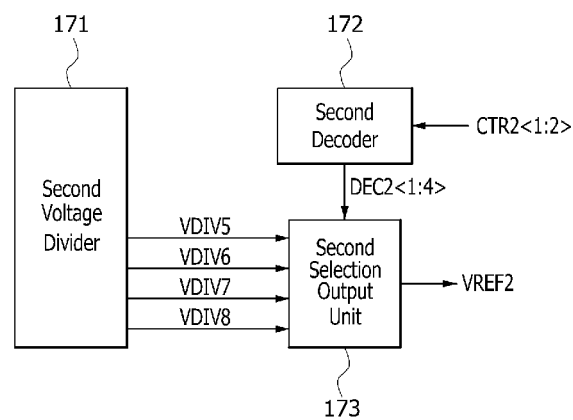
FIG. 6 is a block diagram of a second reference voltage generator included in the impedance calibration circuit shown in FIG. 1 according to an embodiment.

Referring to FIG. 6, the second reference voltage generator 17 includes a second voltage divider 171, a second decoder 172, and a second selection output unit 173. The second voltage divider 171 may have substantially the same configuration as that of the first voltage divider 141 shown in FIG. 3 and divides the power supply voltage VDD to generate a fifth division voltage signal VDIV5 having a fifth division voltage level, a sixth division voltage signal VDIV6 having a sixth division voltage level, a seventh division voltage signal VDIV7 having a seventh division voltage level, and an eighth division voltage signal VDIV8 having an eighth division voltage level. The second decoder 172 decodes the second control code signal CTR2<1:2> to generate a second decode signal DEC2<1:4>. The second selection output unit 173 selects one of the fifth to eighth division voltage signals VDIV5, VDIV6, VDIV7, and VDIV8 in response to the second decode signal DEC2<1:4> and outputs the selected division voltage signal as the second reference voltage signal VREF2.

Operations of the second reference voltage generator 17 will be described hereinafter with reference to a truth table illustrated in FIG. 7. The following description will be developed under the assumption that the sixth division voltage signal VDIV6 is initially selected and outputted as the second reference voltage signal VREF2. When the second calibration voltage signal ZQ2 has a higher level than the second target voltage signal VTAR2, the second control code signal CTR2<1:2> may be counted to decrease by one bit. Thus, only a first signal DEC2<1> of the second decode signal DEC2<1:4> may have a logic "high" state. Accordingly, the fifth division voltage signal VDIV5 having a higher level than the sixth division voltage signal VDIV6 may be selected and outputted as the second reference voltage signal VREF2. On the other hand, when the second calibration voltage signal ZQ2 has a lower level than the second target voltage signal VTAR2, the second control code signal CTR2<1:2> may be counted to increase by one bit. Thus, only a third signal DEC2<3> of the second decode signal DEC2<1:4> may have a logic "high" state. Accordingly, the seventh division voltage signal VDIV7 having a lower level than the sixth division voltage signal VDIV6 may be selected and outputted as the second reference voltage signal VREF2.

As described above, the impedance calibration circuit according to an embodiment may control the levels of the first and second reference voltage signals VREF1 and VREF2 according to the levels of the first and second calibration voltage signals ZQ1 and ZQ2. That is, the level of the first reference voltage signal VREF1 is decreased when the first calibration voltage signal ZQ1 has a higher level than the first target voltage signal VTAR1, and the level of the first reference voltage signal VREF1 is increased when the first calibration voltage signal ZQ1 has a lower level than the first target voltage signal VTAR1. Thus, an operation speed of the impedance calibration circuit may be improved by controlling the levels of the first and second reference voltage signals VREF1 and VREF2 during an impedance calibration operation executed by the first and second calibration voltage drivers 12 and 15.

Figure 8:
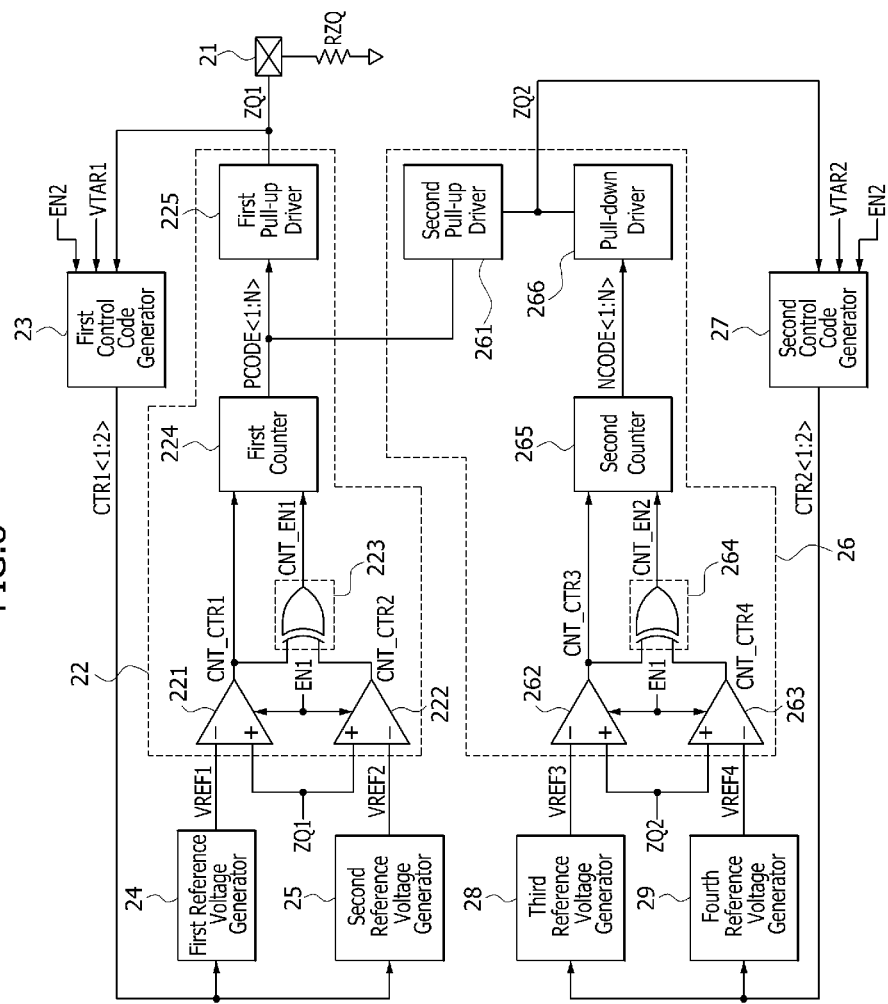
FIG. 8 is a block diagram of an impedance calibration circuit according to another embodiment.

FIG. 8 is a block diagram of an impedance calibration circuit according to another embodiment.

Referring to FIG. 8, the impedance calibration circuit includes a pad 21, a first calibration voltage driver 22, a first control code generator 23, a first reference voltage generator 24, a second reference voltage generator 25, a second calibration voltage driver 26, a second control code generator 27, a third reference voltage generator 28, and a fourth reference voltage generator 29. The pad 21 is electrically coupled to an external resistor RZQ having a constant resistance value regardless of a PVT condition. The first calibration voltage driver 22 operates in response to a first enable signal EN1 and compares a first calibration voltage signal ZQ1 with a first reference voltage signal VREF1 and a second reference voltage signal VREF2 to drive the first calibration voltage signal ZQ1. The first control code generator 23 operates in response to a second enable signal EN2 and compares the first calibration voltage signal ZQ1 with a first target voltage signal VTAR1 to generate a first control code signal CTR1<1:2>.

The first reference voltage generator 24 generates the first reference voltage signal VREF1 in response to the first control code signal CTR1<1:2>. A voltage level of the first reference voltage signal VREF1 is controlled by the first control code signal CTR1<1:2>. The second reference voltage generator 25 generates the second reference voltage signal VREF2 in response to the first control code signal CTR1<1:2>. A voltage level of the second reference voltage signal VREF2 is controlled by the first control code signal CTR1<1:2>.

The second calibration voltage driver 26 operates in response to the first enable signal EN1 and compares a second calibration voltage signal ZQ2 with a third reference voltage signal VREF3 and a fourth reference voltage signal VREF4 to drive the second calibration voltage signal ZQ2. The second control code generator 27 operates in response to the second enable signal EN2 and compares the second calibration voltage signal ZQ2 with a second target voltage signal VTAR2 to generate a second control code signal CTR2<1:2>. The third reference voltage generator 28 generates the third reference voltage signal VREF3 in response to the second control code signal CTR2<1:2>, and a voltage level of the third reference voltage signal VREF3 is controlled by the second control code signal CTR2<1:2>. The fourth reference voltage generator 29 generates the fourth reference voltage signal VREF4 in response to the second control code signal CTR2<1:2>, and a voltage level of the fourth reference voltage signal VREF4 is controlled by the second control code signal CTR2<1:2>.

The first calibration voltage driver 22 includes a first comparator 221, a second comparator 222, a first count enable signal generator 223, a first counter 224, and a first pull-up driver 225. The first comparator 221 compares the first calibration voltage signal ZQ1 with the first reference voltage signal VREF1 to generate a first count control signal CNT_CTR1. The second comparator 222 compares the first calibration voltage signal ZQ1 with the second reference voltage signal VREF2 to generate a second count control signal CNT_CTR2. If the first and second count control signals CNT_CTR1 and CNT_CTR2 have the same logic level, the first count enable signal generator 223 generates a first count enable signal CNT_EN1 that is enabled to have a logic "low" state.

The first counter 224 outputs a counted value, e.g., a pull-up code signal PCODE<1:N>, in response to the first count control signal CNT_CTR1 when the first count enable signal CNT_EN1 having a logic "low" state is inputted thereto. The first pull-up driver 225 pulls up the first calibration voltage signal ZQ1 in response to the pull-up code signal PCODE<1:N>. If the first calibration voltage signal ZQ1 has a higher level than the first and second reference voltage signals VREF1 and VREF2, the first and second count control signals CNT_CTR1 and CNT_CTR2 may be generated to have a logic "high" state, and thus the first count enable signal CNT_EN1 is enabled to have a logic "low" state. As a result, the first counter 224 outputs the pull-up code signal PCODE<1:N> to decrease the level of the first calibration voltage signal ZQ1. If the first calibration voltage signal ZQ1 has a lower level than the first and second reference voltage signals VREF1 and VREF2, the first and second count control signals CNT_CTR1 and CNT_CTR2 may be generated to have a logic "low" state, and thus the first count enable signal CNT_EN1 is enabled to have a logic "low" state. As a result, the first counter 224 outputs the pull-up code signal PCODE<1:N> to increase the level of the first calibration voltage signal ZQ1.

Meanwhile, if the first calibration voltage signal ZQ1 has a level between the first and second reference voltage signals VREF1 and VREF2, the first and second count control signals CNT_CTR1 and CNT_CTR2 may be generated to have different logic states, and thus the first count enable signal CNT_EN1 is disabled to have a logic "high" state. As a result, the first counter 224 is deactivated and does not output the pull-up code signal PCODE<1:N>, and the level of the first calibration voltage signal ZQ1 does not change. The first enable signal EN1 may be enabled during an impedance calibration period. The second enable signal EN2 may be enabled to calibrate the first to fourth reference voltage signals VREF1, VREF2, VREF3, and VREF4 in the impedance calibration period. That is, the second enable signal EN2 may be enabled in a period when the first enable signal EN1 is enabled. In some embodiments, the first and second enable signals EN1 and EN2 may be set to have several different enable periods.

The second calibration voltage driver 26 includes a second pull-up driver 261, a third comparator 262, a fourth comparator 263, a second count enable signal generator 264, a second counter 265, and a pull-down driver 266. The second pull-up driver 261 pulls up the second calibration voltage signal ZQ2 in response to the pull-up code signal PCODE<1:N>. The third comparator 262 compares the second calibration voltage signal ZQ2 with the third reference voltage signal VREF3 to generate a third count control signal CNT_CTR3. The fourth comparator 263 compares the second calibration voltage signal ZQ2 with the fourth reference voltage signal VREF4 to generate a fourth count control signal CNT_CTR4.

If the third and fourth count control signals CNT_CTR3 and CNT_CTR4 have the same logic level, the second count enable signal generator 264 may generate a second count enable signal CNT_EN2 that is enabled to have a logic "low" state. The second counter 265 outputs a pull-down code signal NCODE<1:N> in response to the third count control signal CNT_CTR3 when the second count enable signal CNT_EN2 having a logic "low" state is inputted thereto. The pull-down driver 266 pulls down the second calibration voltage signal ZQ2 in response to the pull-down code signal NCODE<1:N>.

If the second calibration voltage signal ZQ2 has a higher level than the third and fourth reference voltage signals VREF3 and VREF4, the third and fourth count control signals CNT_CTR3 and CNT_CTR4 may be generated to have a logic "high" state, and thus the second count enable signal CNT_EN2 is enabled to have a logic "low" state. As a result, the second counter 265 outputs the pull-down code signal NCODE<1:N> to decrease the level of the second calibration voltage signal ZQ2.

If the second calibration voltage signal ZQ2 has a lower level than the third and fourth reference voltage signals VREF3 and VREF4, the third and fourth count control signals CNT_CTR3 and CNT_CTR4 may be generated to have a logic "low" state, and thus the second count enable signal CNT_EN2 is enabled to have a logic "low" state. As a result, the second counter 265 outputs the pull-down code signal NCODE<1:N> to increase the level of the second calibration voltage signal ZQ2.

If the first calibration voltage signal ZQ2 has a level between the third and fourth reference voltage signals VREF3 and VREF4, the third and fourth count control signals CNT_CTR3 and CNT_CTR4 may be generated to have different logic states, and thus the second count enable signal CNT_EN2 is disabled to have a logic "high" state. The second counter 265 is deactivated and does not output the pull-down code signal NCODE<1:N>, and the level of the second calibration voltage signal ZQ2 does not change.

In terms of configurations and operations, the first control code generator 23 may be similar to the first control code generator 13 described with reference to FIG. 2, and the first and second reference voltage generators 24 and 25 may be similar to the first reference voltage generator 14 described with reference to FIG. 3. Thus, a detailed description of the first control code generator 23, the first reference voltage generator 24, and the second reference voltage generator 25 with reference to FIG. 8 will be omitted. If the first calibration voltage signal ZQ1 has a higher level than the first target voltage signal VTAR1, the first control code generator 23 generates the first control code signal CTR1<1:2> that is increased by one bit. Accordingly, the first and second reference voltage generators 24 and 25 generate the first and second reference voltage signals VREF1 and VREF2 having decreased levels, respectively. On the other hand, if the first calibration voltage signal ZQ1 has a lower level than the first target voltage signal VTAR1, the first control code generator 23 generates the first control code signal CTR1<1:2> that is decreased by one bit. Accordingly, the first and second reference voltage generators 24 and 25 generate the first and second reference voltage signals VREF1 and VREF2 having increased levels, respectively.

In terms of configurations and operations, the second control code generator 27 may be similar to the second control code generator 16 described with reference to FIG. 5, and the third and fourth reference voltage generators 28 and 29 may be similar to the second reference voltage generator 17 described with reference to FIG. 6. Thus, a detailed description of the second control code generator 27, the third reference voltage generator 28, and the fourth reference voltage generator 29 with respect to FIG. 8 will be omitted. If the second calibration voltage signal ZQ2 has a higher level than the second target voltage signal VTAR2, the second control code generator 27 generates the second control code signal CTR2<1:2> that is increased by one bit. Accordingly, the third and fourth reference voltage generators 28 and 29 generate the third and fourth reference voltage signals VREF3 and VREF4 having increased levels, respectively. On the other hand, if the second calibration voltage signal ZQ2 has a lower level than the second target voltage signal VTAR2, the second control code generator 27 generates the second control code signal CTR2<1:2> that is decreased by one bit. Accordingly, the third and fourth reference voltage generators 28 and 29 generate the third and fourth reference voltage signals VREF3 and VREF4 having decreased levels, respectively.

As described above, the impedance calibration circuit according to embodiments controls the levels of the first to fourth reference voltage signals VREF1, VREF2, VREF3, and VREF4 according to the levels of the first and second calibration voltage signals ZQ1 and ZQ2. That is, the levels of the first and second reference voltage signals VREF1 and VREF2 are decreased when the first calibration voltage signal ZQ1 has a higher level than the first target voltage signal VTAR1, and the levels of the first and second reference voltage signals VREF1 and VREF2 are increased when the first calibration voltage signal ZQ1 has a lower level than the first target voltage signal VTAR1. Thus, an operation speed of the impedance calibration circuit may be improved by controlling the levels of the first to fourth reference voltage signals VREF1, VREF2, VREF3, and VREF4 during an impedance calibration operation executed by the first and second calibration voltage drivers 22 and 26.

Figure 9:
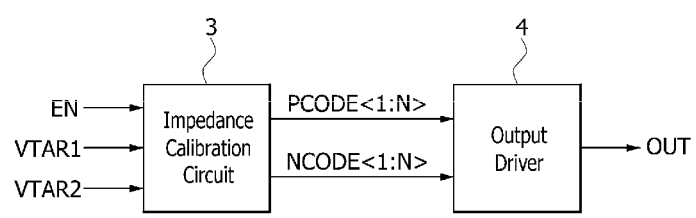
FIG. 9 is a block diagram of an integrated circuit including an impedance calibration circuit according to embodiments.

FIG. 9 is a block diagram of an integrated circuit including any one of impedance calibration circuits according to embodiments.

Referring to FIG. 9, the integrated circuit includes an impedance calibration circuit 3 and an output driver 4. The impedance calibration circuit 3 generates a pull-up code signal PCODE<1:N> and a pull-down code signal NCODE<1:N> by controlling levels of reference voltage signals, which are used therein, according to levels of first and second target voltage signals VTAR1 and VTAR2 in a period set by an enable signal EN. The output driver 4 calibrates impedance matching by controlling impedances of a pull-up driver and a pull-down driver therein according to the pull-up code signal PCODE<1:N> and the pull-down code signal NCODE<1:N>.

The above-described embodiments have been disclosed above for illustrative purposes. Those skilled in the art will appreciate that various modifications, additions and substitutions are possible, without departing from the scope and spirit of the present invention as disclosed in the accompanying claims.

What is claimed is:

1. An impedance calibration circuit, comprising:
 a first calibration voltage driver configured to operate in response to a first enable signal, compare a first calibration voltage signal with a first reference voltage signal, and drive the first calibration voltage signal according to a comparison result;
 a first control code generator configured to operate in response to a second enable signal, compare the first calibration voltage signal with a first target voltage signal, and generate a first control code signal; and
 a first reference voltage generator configured to generate the first reference voltage signal in response to the first control code signal,
 wherein a voltage level of the first reference voltage signal is controlled by the first control code signal, and
 wherein the first calibration voltage signal is induced at a pad coupled to an external resistor.

2. The circuit of claim 1, wherein the first calibration voltage driver includes:
 a first comparator configured to compare the first calibration voltage signal with the first reference voltage signal to generate a first count control signal;
 a first counter configured to output a pull-up code signal that is counted in response to the first count control signal; and
 a first pull-up driver configured to pull up the first calibration voltage signal in response to the pull-up code signal.

3. The circuit of claim 1, wherein the second enable signal is enabled in a period when the first enable signal is enabled.

4. The circuit of claim 1, wherein the first control code generator is configured to generate the first control code signal for decreasing the voltage level of the first reference voltage signal when the first calibration voltage signal has a higher level than the first target voltage signal.

5. The circuit of claim 4, wherein the first control code generator is configured to generate the first control code signal for increasing the voltage level of the first reference voltage signal when the first calibration voltage signal has a lower level than the first target voltage signal.

6. The circuit of claim 5, wherein the first control code generator includes:
 a first comparison signal generator configured to operate in response to the second enable signal, compare the first calibration voltage signal with the first target voltage signal, and generate a first comparison signal; and
 a first code counter configured to output the first control code signal that is counted in response to the first comparison signal.

7. The circuit of claim 1, wherein the first reference voltage generator includes:
 a voltage divider configured to divide a power supply voltage, and generate a plurality of division voltage signals having different division voltages from each other;
 a decoder configured to decode the first control code signal, and generate a first decode signal; and
 a first selection output unit configured to select one of the plurality of division voltage signals in response to the first decode signal, and output the selected division voltage signal as the first reference voltage signal.

8. The circuit of claim 1, further comprising:
 a second calibration voltage driver configured to operate in response to the first enable signal, compare a second calibration voltage signal with a second reference voltage signal, and drive the second calibration voltage signal according to the comparison result;
 a second control code generator configured to operate in response to the second enable signal, compare the second calibration voltage signal with a second target voltage signal, and generate a second control code signal; and
 a second reference voltage generator configured to generate the second reference voltage signal in response to the second control code signal,
 wherein a voltage level of the second reference voltage signal is controlled by the second control code signal.

9. The circuit of claim 8, wherein the second calibration voltage driver includes:
- a second comparator configured to compare the second calibration voltage signal with the second reference voltage signal, and generate a second count control signal;
- a second counter configured to output a pull-down code signal that is counted in response to the second count control signal;
- a pull-down driver configured to pull down the second calibration voltage signal in response to the pull-down code signal; and
- a second pull-up driver configured to pull up the second calibration voltage signal in response to a pull-up code signal that is counted based on a comparison result of the first calibration voltage signal and the first reference voltage signal.

10. The circuit of claim 8, wherein the second control code generator is configured to generate the second control code signal for increasing the voltage level of the second reference voltage signal when the second calibration voltage signal has a higher level than the second target voltage signal.

11. The circuit of claim 10, wherein the second control code generator is configured to generate the second control code signal for decreasing the voltage level of the second reference voltage signal when the second calibration voltage signal has a lower level than the second target voltage signal.

12. The circuit of claim 11, wherein the second control code generator includes:
- a second comparison signal generator configured to operate in response to the second enable signal, compare the second calibration voltage signal with the second target voltage signal, and generate a second comparison signal; and
- a second code counter configured to output the second control code signal that is counted in response to the second comparison signal.

13. An impedance calibration circuit, comprising:
- a first calibration voltage driver configured to operate in response to a first enable signal, compare a first calibration voltage signal with first and second reference voltage signals, and drive the first calibration voltage signal according to a comparison result;
- a first control code generator configured to operate in response to a second enable signal, compare the first calibration voltage signal with a first target voltage signal, and generate a first control code signal; and
- a first reference voltage generator configured to generate the first and second reference voltage signals in response to the first control code signal,
- wherein a voltage level of the first and second reference voltage signals, respectively, is controlled by the first control code signal, and
- wherein the first calibration voltage signal is induced at a pad coupled to an external resistor.

14. The circuit of claim 13, wherein the first calibration voltage driver includes:
- a first comparator configured to compare the first calibration voltage signal with the first reference voltage signal, and generate a first count control signal;
- a second comparator configured to compare the first calibration voltage signal with the second reference voltage signal, and generate a second count control signal;
- a first count enable signal generator configured to generate a first count enable signal in response to the first and second count control signals;
- a first counter configured to output a pull-up code signal that is counted in response to the first count control signal and the first count enable signal; and
- a first pull-up driver configured to pull up the first calibration voltage signal in response to the pull-up code signal.

15. The circuit of claim 13, wherein the second enable signal is enabled in a period when the first enable signal is enabled.

16. The circuit of claim 13, wherein the first control code generator is configured to generate the first control code signal for decreasing each of the voltage levels of the first and second reference voltage signals when the first calibration voltage signal has a higher level than the first target voltage signal.

17. The circuit of claim 16, wherein the first control code generator is configured to generate the first control code signal for increasing each of the voltage levels of the first and second reference voltage signals when the first calibration voltage signal has a lower level than the first target voltage signal.

18. The circuit of claim 13, further comprising:
- a second calibration voltage driver configured to operate in response to the first enable signal, compare a second calibration voltage signal with third and fourth reference voltage signals, and drive the second calibration voltage signal according to a comparison result;
- a second control code generator configured to operate in response to the second enable signal, compare the second calibration voltage signal with a second target voltage signal, and generate a second control code signal; and
- a second reference voltage generator configured to generate the third and fourth reference voltage signals in response to the second control code signal,
- wherein a voltage level of the third and fourth reference voltage signals, respectively, is controlled by the second control code signal.

19. The circuit of claim 18, wherein the second calibration voltage driver includes:
- a third comparator configured to compare the second calibration voltage signal with the third reference voltage signal, and generate a third count control signal;
- a fourth comparator configured to compare the second calibration voltage signal with the fourth reference voltage signal, and generate a fourth count control signal;
- a second count enable signal generator configured to generate a second count enable signal in response to the third and fourth count control signals;
- a second counter configured to output a pull-down code signal that is counted in response to the third count control signal and the second count enable signal;
- a pull-down driver configured to pull down the second calibration voltage signal in response to the pull-down code signal; and
- a second pull-up driver configured to pull up the second calibration voltage signal in response to a pull-up code signal that is counted based on a comparison result of the first calibration voltage signal and the first and second reference voltage signals.

20. The circuit of claim 18, wherein the second control code generator is configured to generate the second control code signal for increasing each of the voltage levels of the third and fourth reference voltage signals when the second calibration voltage signal has a higher level than the second target voltage signal.

21. The circuit of claim 20, wherein the second control code generator is configured to generate the second control code signal for decreasing each of the voltage levels of the third and fourth reference voltage signals when the second calibration voltage signal has a lower level than the second target voltage signal.

* * * * *